United States Patent
Pichumani et al.

(10) Patent No.: US 12,176,182 B2
(45) Date of Patent: Dec. 24, 2024

(54) AUTOMATED OPERATIONAL CONTROL OF MICRO-TOOLING DEVICES

(71) Applicant: Carl Zeiss SMT GmbH, Oberkochen (DE)

(72) Inventors: Ramani Pichumani, Palo Alto, CA (US); Anthony Morin, Portsmouth, NH (US); David Dryden, Mountain House, CA (US); Heyjin Chris Park, Pleasanton, CA (US)

(73) Assignee: Carl Zeiss SMT GmbH, Oberkochen (DE)

(*) Notice: Subject to any disclaimer, the term of this patent is extended or adjusted under 35 U.S.C. 154(b) by 468 days.

(21) Appl. No.: 17/580,996

(22) Filed: Jan. 21, 2022

(65) Prior Publication Data
US 2022/0148850 A1    May 12, 2022

Related U.S. Application Data

(63) Continuation of application No. PCT/EP2020/070796, filed on Jul. 23, 2020.
(Continued)

(30) Foreign Application Priority Data

Oct. 18, 2019    (DE) .......................... 102019128213.6

(51) Int. Cl.
*H01J 37/26*    (2006.01)
*G06N 20/00*    (2019.01)
(Continued)

(52) U.S. Cl.
CPC ............ *H01J 37/265* (2013.01); *G06N 20/00* (2019.01); *H01J 37/222* (2013.01); *H01J 37/28* (2013.01); *H01J 2237/0807* (2013.01)

(58) Field of Classification Search
CPC ........ H01J 37/222; H01J 37/265; H01J 37/28; H01J 2237/0807
See application file for complete search history.

(56) References Cited

U.S. PATENT DOCUMENTS

| 9,576,772 B1 * | 2/2017 | Arjavac | ................... H01J 37/28 |
| 2006/0071166 A1 * | 4/2006 | Sato | ........................ H01J 37/28 |
| | | | 250/310 |

(Continued)

FOREIGN PATENT DOCUMENTS

| CN | 105408746 A | 3/2016 |
| CN | 109447141 A | 3/2019 |

(Continued)

OTHER PUBLICATIONS

Peng et al., "Real Time Optimization of Robotic Arc Welding Based on Machine Vision and Neural Networks", in IECON'98, Proceedings of the 24th Annual Conference of the IEEE Industrial Electronics Society (Cat. No 98CH36200), IEEE, 1998, S. 1279-1283 (Year: 1998).*

(Continued)

*Primary Examiner* — David E Smith
(74) *Attorney, Agent, or Firm* — Fish & Richardson P.C.

(57) ABSTRACT

A micro-tooling device, such as, for example, a scanning electron microscope or a focused-ion beam microscope, provides images. A first machine-learning algorithm and a second machine-learning algorithm are sequentially coupled. The first machine-learning algorithm determines a progress along a predefined workflow based on feature recognition in images associated with the workflow. The second machine-learning algorithm predicts settings of operational parameters of the micro-tooling device in accordance with the progress along the predefined workflow.

20 Claims, 7 Drawing Sheets

Related U.S. Application Data

(60) Provisional application No. 62/878,817, filed on Jul. 26, 2019.

(51) Int. Cl.
  *H01J 37/22* (2006.01)
  *H01J 37/28* (2006.01)

(56) References Cited

U.S. PATENT DOCUMENTS

| | | |
|---|---|---|
| 2006/0278826 A1 | 12/2006 | Roberts et al. |
| 2014/0247972 A1 | 9/2014 | Wang et al. |
| 2018/0164792 A1 | 6/2018 | Lin et al. |
| 2018/0217584 A1 | 8/2018 | Fischer et al. |
| 2018/0321465 A1 | 11/2018 | Xu et al. |
| 2019/0004504 A1 | 1/2019 | Yati |

FOREIGN PATENT DOCUMENTS

| | | | |
|---|---|---|---|
| JP | 2013-152912 | | 8/2013 |
| JP | 2013152912 A | * | 8/2013 |
| JP | 2015-532709 | | 11/2015 |
| WO | WO2009093247 A1 | | 7/2009 |
| WO | WO 2014/018694 | | 1/2014 |

OTHER PUBLICATIONS

Peng et al., "Real Time Optimization of Robotic Arc Welding Based on Machine Vision and Neural Networks", in IECON'96, Proceedings of the 24th Annual Conference of the IEEE Industrial Electronics Society, Cat. No 98CH36200, IEEE, 1996, S. 1279-1283 (Year: 1996).*

Taiwanese Office Action, with translation thereof, for corresponding Appl No. 109122725, dated Feb. 9, 2022.

Japanese Office Action, with translation thereof, for corresponding JP Appl No. 2022-505350, dated Feb. 6, 2022.

Japanese Office Action, with translation thereof, for corresponding JP Appl No. 2022-505350, dated Sep. 12, 2023.

Hlawacek, Gregor, et al. "Helium ion microscopy." Journal of Vacuum Science & Technology B, Nanotechnology and Microelectronics: Materials, Processing, Measurement, and Phenomena 32.2 (2014): 020801.

German Office Action, with translation thereof, for corresponding DE Appl No. 10 2019 128 213.6, dated Jul. 13, 2020.

International Search Report and Written Opinion for corresponding Appl No. PCT/EP2020/070796, mailed Dec. 18, 2020.

Andreas Rampe: "Raith Software Reference Manual Version 5.0", Jan. 1, 2007 (Jan. 1, 2007), XP055236604, Retrieved from the Internet: URL: http://research.physics.illinois.edu/bezryadin/labprotocol/e_LiNE Software Reference Manual.pdf [retrieved on Dec. 15, 2015] pp. 135-136.

Peng, J., et al. "Real time optimization of robotic arc welding based on machine vision and neural networks". In IECON'98. Proceedings of the 24th Annual Conference of the IEEE Industrial Electronics Society (Cat. No. 98CH36200). IEEE, 1998. S. 1279-1283. doi: 10.1109/IECON.1998.722833 (URL: https://ieeexplore.ieee.org/iel4/5851/15628/00722833.pdf).

Rashidi, M., Wolkow, R .. Autonomous scanning probe microscopy in situ tip conditioning through machine earning. In: ACS Nano, 2018, 12. Jg., Nr. 6, S. 5185-5189. doi: 10.1021/acsnano.8b02208 (URL: https://arxiv.org/pdf/1803.07059).

Chinese Office Action, with translation thereof, for corresponding CN Application No. 202080054168.4, dated May 15, 2024.

* cited by examiner

AUTOMATED OPERATIONAL CONTROL OF MICRO-TOOLING DEVICES

CROSS-REFERENCE TO RELATED APPLICATIONS

The present application is a continuation of, and claims benefit under 35 USC 120 to, international application PCT/EP2020/070796, filed Jul. 23, 2020, which claims benefit under 35 USC 119 of German Application No. 10 2019 128 213.6, filed Oct. 18, 2019, 2014. International application PCT/EP2020/070796 also claims priority under 35 USC 119(e) to U.S. Provisional Application No. 62/878,817, filed Jul. 26, 2019. The entire disclosure of these applications are incorporated by reference herein.

FIELD

The disclosure generally relates to automating operational control of a micro-tooling device. The disclosure also generally relates to automating operational control using machine-learning algorithms.

BACKGROUND

Micro-tooling devices can facilitate interaction with microscopic or sub-microscopic samples, e.g., semiconductor devices, wafers, biological samples, micro-optics, etc. For instance, the interaction can include microscopic imaging of samples. Examples of imaging modalities that can be relied upon by micro-tooling devices include scanning electron microscopy (SEM), atomic force microscopy (AFM), x-ray imaging, focused ion-beam (FIB) imaging, etc. The interaction can also include micro-manipulation of the sample. Examples would include FIB milling, exposure of a resist using lithography tools, preparation of tunnel electron microscopy (TEM) lamellas, material deposition, etc.

Such micro-tooling devices typically have a large space of available settings of operational parameters. In other words, the degree of freedom in choosing the appropriate setting of the operational parameters is large. Further, often there is a parameter drift observed such that the settings need to be adjusted over the course of time. This generally makes the operation of the micro-tooling device a complex and error prone task. For example, skilled personnel may be involved to implement complex workflows when operating the micro-tooling device.

Accordingly, it has been found that the operation of micro-tooling device can have various restrictions and drawbacks. For example, the need for skilled personnel limits the availability of the micro-tooling devices to certain specific tasks. A widespread use, e.g., in the wafer fabrication, is typically not possible due to restricted throughput. Further, due to the complexity of the control of the settings of the operational parameters, the operational control can be error prone. Sometimes, it is even possible that damage is caused to the sample or the micro-tooling device based on human error, e.g., due to collisions of micro-manipulation tools with optics, etc.

SUMMARY

The disclosure seeks to provide advanced techniques of controlling operation of a micro-tooling device, such as techniques that can overcome or mitigate at least some of the above-identified restrictions and drawbacks.

In an aspect, the disclosure provides a method of controlling operation of a micro-tooling device includes obtaining a time series of images. The images are acquired while using one or more first settings of operational parameters of the micro-tooling device. The method also includes providing each one of the images of the time series of the images to one or more first algorithms and obtaining a time series of one or more properties of a predefined feature included in the images from the one or more first algorithms. The method further includes providing the time series of the one or more properties to a second algorithm and obtaining a prediction for a second setting of the operational parameters of the micro-tooling device from the second algorithm. The method further includes controlling the operation of the micro-tooling device in accordance with the second setting of the operational parameters.

In an aspect, that disclosure provides a computer program or a computer-program product or a computer-readable storage medium that includes program code. The program code can be loaded and executed by at least one processor. Upon executing the program code, the at least one processor performs a method of controlling operation of a micro-tooling device. The method includes obtaining a time series of images. The images are acquired while using one or more first settings of operational parameters of the micro-tooling device. The method also includes providing each one of the images of the time series of the images to one or more first algorithms and obtaining a time series of one or more properties of a predefined feature included in the images from the one or more first algorithms. The method further includes providing the time series of the one or more properties to a second algorithm and obtaining a prediction for a second setting of the operational parameters of the micro-tooling device from the second algorithm. The method further includes controlling the operation of the micro-tooling device in accordance with the second setting of the operational parameters.

In an aspect, the disclosure provides a micro-tooling device that includes a control circuitry. The control circuitry is configured to obtain a time series of images, the images being acquired while using one or more first settings of operational parameters of the micro-tooling device. The control circuitry is further configured to provide each one of the images of the time series of the images to one or more first algorithms and obtain a time series of one or more properties of a predefined feature included in the images from the one or more first algorithms. The control circuitry is further configured to provide the time series of the one or more properties to a second algorithm and obtaining a prediction for a second setting of the operational parameters of the micro-tooling device from the second algorithm. The control circuitry is further configured to control the operation of the micro-tooling device in accordance with the second setting of the operational parameters.

In an aspect, the disclosure provides a method of controlling operation of a micro-tooling device that includes using a first machine-learning algorithm and a second machine-learning algorithm that are sequentially coupled. The first machine-learning algorithm determines a progress along a predefined workflow based on feature recognition in images associated with the workflow. The second machine-learning algorithm predicts settings of operational parameters of the micro-tooling device in accordance with the progress along the predefined workflow.

In an aspect, the disclosure provides a computer program or a computer-program product or a computer-readable storage medium that includes program code. The program code can be loaded and executed by at least one processor. Upon executing the program code, the at least one processor performs a method of controlling operation of a micro-tooling device. The method includes using a first machine-learning algorithm and a second machine-learning algorithm that are sequentially coupled. The first machine-learning algorithm determines a progress along a predefined workflow based on feature recognition in images associated with the workflow. The second machine-learning algorithm predicts settings of operational parameters of the micro-tooling device in accordance with the progress along the predefined workflow.

In an aspect, the disclosure provides a micro-tooling device that includes a control circuitry configured to use a first machine-learning algorithm and a second machine-learning algorithm that are sequentially coupled. The first machine-learning algorithm determines a progress along a predefined workflow based on feature recognition in images associated with the workflow. The second machine-learning algorithm predicts settings of operational parameters of the micro-tooling device in accordance with the progress along the predefined workflow.

It is to be understood that the features mentioned above and those yet to be explained below may be used not only in the respective combinations indicated, but also in other combinations or in isolation without departing from the scope of the disclosure.

DETAILED DESCRIPTION OF EMBODIMENTS

Figure 1:
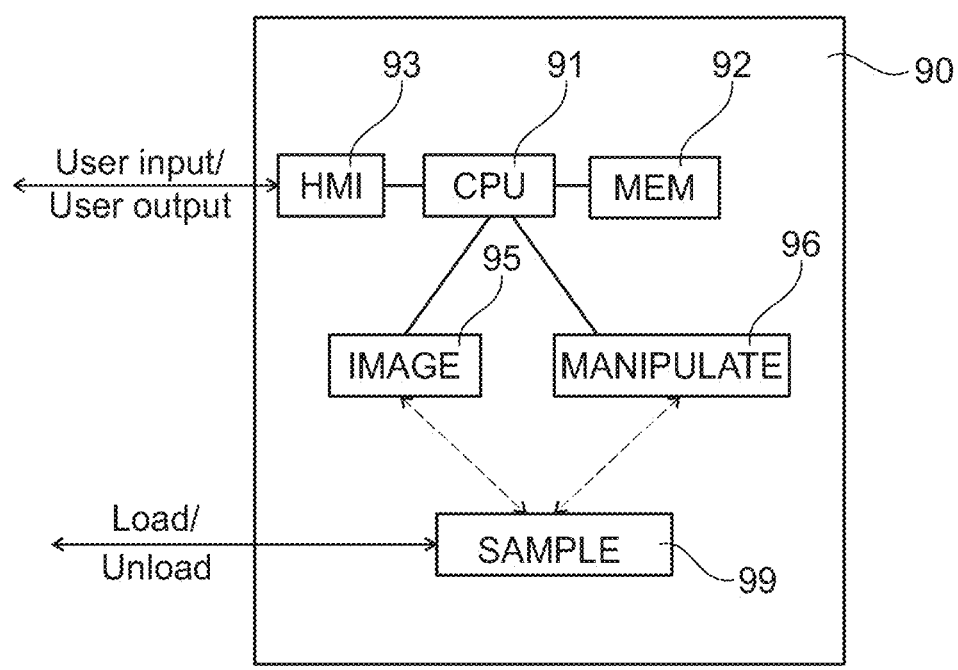
FIG. 1 schematically illustrates a micro-tooling device according to various examples.

Some examples of the present disclosure generally provide for a plurality of circuits or other electrical devices. All references to the circuits and other electrical devices and the functionality provided by each are not intended to be limited to encompassing only what is illustrated and described herein. While particular labels may be assigned to the various circuits or other electrical devices disclosed, such labels are not intended to limit the scope of operation for the circuits and the other electrical devices. Such circuits and other electrical devices may be combined with each other and/or separated in any manner based on the particular type of electrical implementation that is desired. It is recognized that any circuit or other electrical device disclosed herein may include any number of microcontrollers, a graphics processor unit (GPU), integrated circuits, memory devices (e.g., FLASH, random access memory (RAM), read only memory (ROM), electrically programmable read only memory (EPROM), electrically erasable programmable read only memory (EEPROM), or other suitable variants thereof), and software which co-act with one another to perform operation(s) disclosed herein. In addition, any one or more of the electrical devices may be configured to execute a program code that is embodied in a non-transitory computer readable medium programmed to perform any number of the functions as disclosed.

In the following, embodiments of the disclosure will be described in detail with reference to the accompanying drawings. It is to be understood that the following description of embodiments is not to be taken in a limiting sense. The scope of the disclosure is not intended to be limited by the embodiments described hereinafter or by the drawings, which are taken to be illustrative only.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Hereinafter, techniques of controlling operation of a micro-tooling device will be described. These techniques can be used in various use cases and for various kinds and types of micro-tooling devices. For instance, the techniques can be used to control the operation of an microscopy imaging module of the micro-tooling device. Alternatively or additionally, the techniques can be used to control the operation of a micro-manipulation module of the micro-tooling device. Example microscopy imaging modules of micro-tooling devices include, but are not limited to: SEM; FIB microscopy; x-ray microscopy; AFM; light field microscopy; laser scanning microscopy; super-resolution microscopy, e.g., using luminescence; light microscopy in the brightfield or darkfield; etc. Example micro-manipulation modules of micro-tooling devices include, but are not limited to: FIB milling; electron or photon exposure; micro-manipulators such as electrical contacts; etc.

As a general rule, the term "micro" as used herein denotes a property that is on the spatial length scale of micrometers or smaller (e.g., nanometers).

Hereinafter, techniques will be described that facilitate automation of the controlling of the operation of the micro-tooling device. More specifically, it is possible to automate a workflow associated with the operation of the micro-tooling device. The workflow may be characterized by multiple steps. The workflow could provide imaging and/or manipulation of the sample, e.g., in accordance with certain predefined desired properties. More generally, the workflow could prepare for imaging and/or manipulation. Thus, operation may be controlled such that subsequently imaging and/or manipulation of the sample is possible. For instance, the workflow may define a sequence of steps associated with respective control operations that sequentially adjust settings of operational parameters of the micro-tooling device, e.g., to achieve a certain goal—e.g., certain imaging modalities or micro-manipulation tasks.

Depending on the implementation, a larger or smaller degree of automation is possible. For instance, according to some examples, user output and/or user input (user interaction) may be relied upon along the workflow associated with the operational control. Thereby, continued user guidance can be facilitated. In other examples, the workflow can be fully automated.

As a general rule, depending on the kind and type of micro-tooling device and, furthermore, depending on the kind and type of workflow, the operational parameters and the appropriate settings subject to the automated operational control may widely vary. The settings may specify the actual values taken by the operational parameters. For example, for particle-based imaging techniques such as SEM or FIB imaging, operational parameters could be the acceleration or extraction voltages, pressure at the sample or sample stage, particle flux, optics, focus, aperture, dwell time, source distance, sample-stage tilt and position, to name just a few. For example, for manipulation techniques using micromanipulators, the orientation and position, the drive path, etc. of the micromanipulators would be examples of operational parameters.

Various techniques described herein rely on computer-implemented logic for automation of the operational control of the micro-tooling device. For example, according to various examples, one or more algorithms may be used in order to computer-implement one or more tasks associated with the operational control. In some examples, at least some of the one or more algorithms may rely on techniques of machine learning. In this regard, the algorithm may not be a-priori defined, but rather be configured in a training phase based on training data. Patterns may be detected and inference from knowledge acquired during the training phase may be relied upon. Here, based on user input a (semi-) supervised learning can be implemented that configures the machine-learning algorithm. This is different to non-machine-learning algorithms that are a-priori configured and are not trained based on data.

According to examples, a two-step approach is employed. Here, a first algorithm and a second algorithm are sequentially arranged. I.e., an output of the first algorithm forms an input of the second algorithm. It is possible that the first algorithm and/or the second algorithm include a machine-learning kernel, i.e., are machine-learning algorithms.

The first algorithm and the second algorithm can perform different tasks. For example, it is possible that the first algorithm determines a property of a predefined feature in images engaged with the micro-tooling device.

The predefined feature may be associated with a workflow for the operation of the micro-tooling device. The particular appearance of the predefined feature may be associated with the progress along the workflow. The property determined by the first algorithm may be indicative of the appearance of the predefined feature. For example, the predefined feature may be associated with a degree of completion of the workflow. For example, if the workflow of the operation of the micro-tooling device has been successfully completed, the predefined feature may be clearly visible in the images or may be absent from the images, depending on the implementation. To give an example: the predefined feature could be implemented by an alignment marker of a semiconductor structure depicted in images. The workflow of operation may be associated with focusing and aligning a SEM imaging module. If the alignment marker is in-focus in an image acquired by the SEM imaging module, then the alignment has been successfully completed. Thus, it would be possible to determine a sharpness factor or contrast as the property of the alignment marker feature, using the first algorithm. The sharpness factor—or, generally, any other property—may gradually vary between a minimum and maximum value.

Then, it would be possible to provide the output of the first algorithm—i.e., the priority of the predefined feature—as an input to the second algorithm. The second algorithm can then predict a future setting of one or more operational parameters of the micro-tooling device. The prediction can, in other words, pertain to a setting that is not yet implemented, but that could be implemented in the future, to achieve a certain goal. For example, the future setting that is predicted by the second algorithm could be applied to achieve a goal that is associated with the workflow for which the operation of the micro-tooling device is controlled in an automated manner.

Accordingly, it is then possible to control the operation of the micro-tooling device in accordance with the future setting of the control parameters.

In detail, it would be possible that the second algorithm operates based on a time series of properties of the predefined feature, to make the prediction. In this regard, it would be possible that the first algorithm is executed multiple times, for multiple images at different points in time. Thereby, a time series of properties of the predefined feature is obtained and the time series of the states can be provided as input to the second algorithm, to make the prediction. Based on such time series, a prediction can be made.

An example implementation of a machine-learning kernel of the second algorithm is based on a recurrent neural network (RNN). Such RNN can operate on the time series as input. Another example implementation would include multilayer perceptron (MLP) or another feedforward artificial neural network.

By using such a 2-step approach including the first algorithm and the second algorithm in sequence, an accurate prediction of the future setting of the control parameters of the micro-tooling device can be achieved. For example, it is possible to firstly analyze the one or more properties of the predefined feature, the feature being associated with the workflow that is intended to be automated, using the first algorithm. Then based on this pre-evaluation, the prediction of the appropriate setting to make progress along the workflow is possible, using the second algorithm.

FIG. 1 schematically illustrates a micro-tooling device 90 according to various examples. The micro-tooling device 90 includes an imaging module 95 and a micro-manipulation module 96. In the various examples described herein, it would be possible that the micro-tooling device 90 includes the imaging module 95 or a micro-manipulation module 96, or both.

A sample 99 may be loaded into the micro-tooling device 90, to facilitate interaction between the micro-tooling device 90 and the sample 99.

The microscopic imaging module 95 is configured to interact with a sample 99 that by acquiring microscopic images thereof.

The micro-manipulation module 96 is configured to interact with the sample 99 by manipulating a structure thereof. For instance, material of the sample 99 may be removed, or material may be deposited on a surface of the sample 99. Material may be implanted into the sample 99. Lithography can be employed where the manipulation is implemented spatially resolved.

The micro-tooling device 90 also includes a processor 91 coupled with a memory 92. The processor 91 and the memory 92 form a control circuitry. For instance, the processor 91 could load program code from the memory 92 and execute the program code. Executing the program code can cause the processor 91 to perform one or more of the following: executing one or more algorithms associated with the operational control of the micro-tooling device 90 and, for example, the imaging module 95 and/or the micro-manipulation module 96; performing a training of one or more machine learning algorithms, e.g., based on user input received from a human machine interface (HMI) 93; controlling the operation of the micro-tooling device 90, for example of the imaging module 95 and/or the micromanipulation module 96, e.g., based on an output of one or more algorithms.

Figure 2:
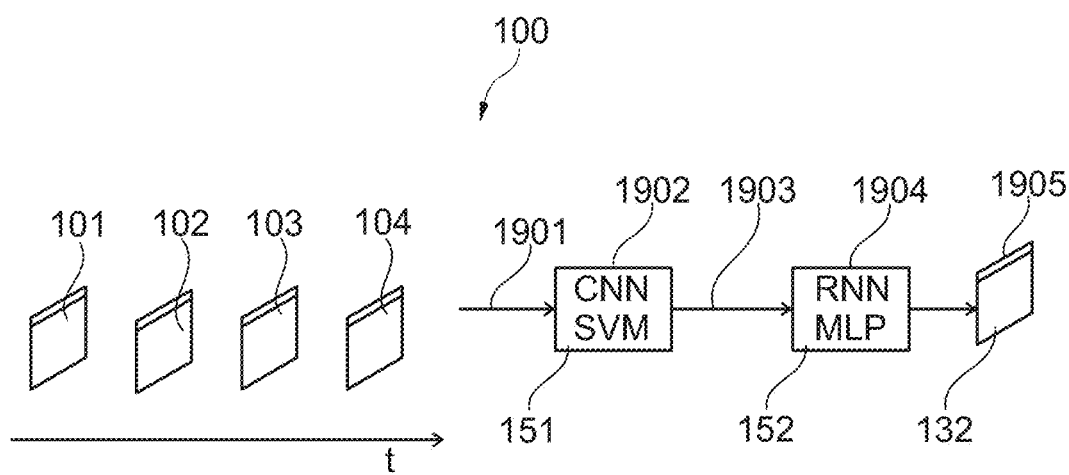
FIG. 2 schematically illustrates automation of a workflow implemented on the micro-tooling device using two sequentially arranged algorithms according to various examples.

FIG. 2 is a functional flowchart. FIG. 2 illustrates aspects in connection with the operational control of the micro-tooling device 90.

Initially, a time series 100 of images 101-104 is obtained. The images 101-104 may or may not depict a sample. In one example, the images 101-104 could be acquired by the imaging model 95 of the micro-tooling device 90. Alternatively or additionally, the images 101-104 could be acquired by another imaging modality. It would be possible that for cross-modality tools the images 101-104 are acquired using a first modality and depict a second modality. For instance, the images 101-104 could be acquired using a SEM and could depict a micro-manipulator.

At 1901, the time series 100 of the images 101-104 is provided as an input to an algorithm 151. In the example of FIG. 2, the algorithm 151 is implemented as a convolutional neural network (CNN) or a support vector machine (SVM); more generally, the algorithm 151 may be implemented using a machine-learning kernel. For sake of simplicity, hereinafter, it is assumed that the algorithm 151 is implemented as a SVM, but other scenarios are conceivable.

The algorithm 151 is then executed at 1902. At 1903, the SVM 151 outputs one or more properties of a predefined feature included in the images 101-104. The SVM 151 may be trained to determine the one or more properties of the predefined feature.

More specifically, the SVM 151 can output a time series/temporal sequence of the one or more properties of the predefined feature. For example, the SVM 151 could be executed once per image 101-104 of the time series 100. For each execution of the SVM 151 at 1902, the respective one or more properties of the predefined feature in the respective image 101-104 may be output.

Then, this time series is input to the algorithm 152 which is executed at 1904. In the example of FIG. 2, the algorithm 152 is implemented as RNN or MLP. For sake of simplicity, reference will be made to an implementation of the algorithm 152 is MLP hereinafter, but other implementations would be possible.

The MLP 152 then predicts a future setting 132 of one or more operational parameters of the micro-tooling device 90; those are output at 1905 and it would be possible to control the operation of the micro-tooling device 90 in accordance with this setting 132.

The example of FIG. 2 facilitates an accurate automated control of the micro-tooling device 90, e.g., to implement a certain workflow associated with the predefined feature. For example, the MLP 152 can predict the future setting 132 such that, upon controlling the operation of the micro-tooling device 90 in accordance with the future setting 132, the one or more properties of the predefined feature art in accordance with set/target properties of the workflow. This will be explained in further detail in connection with FIG. 3 using a concrete example use case.

Figure 3:
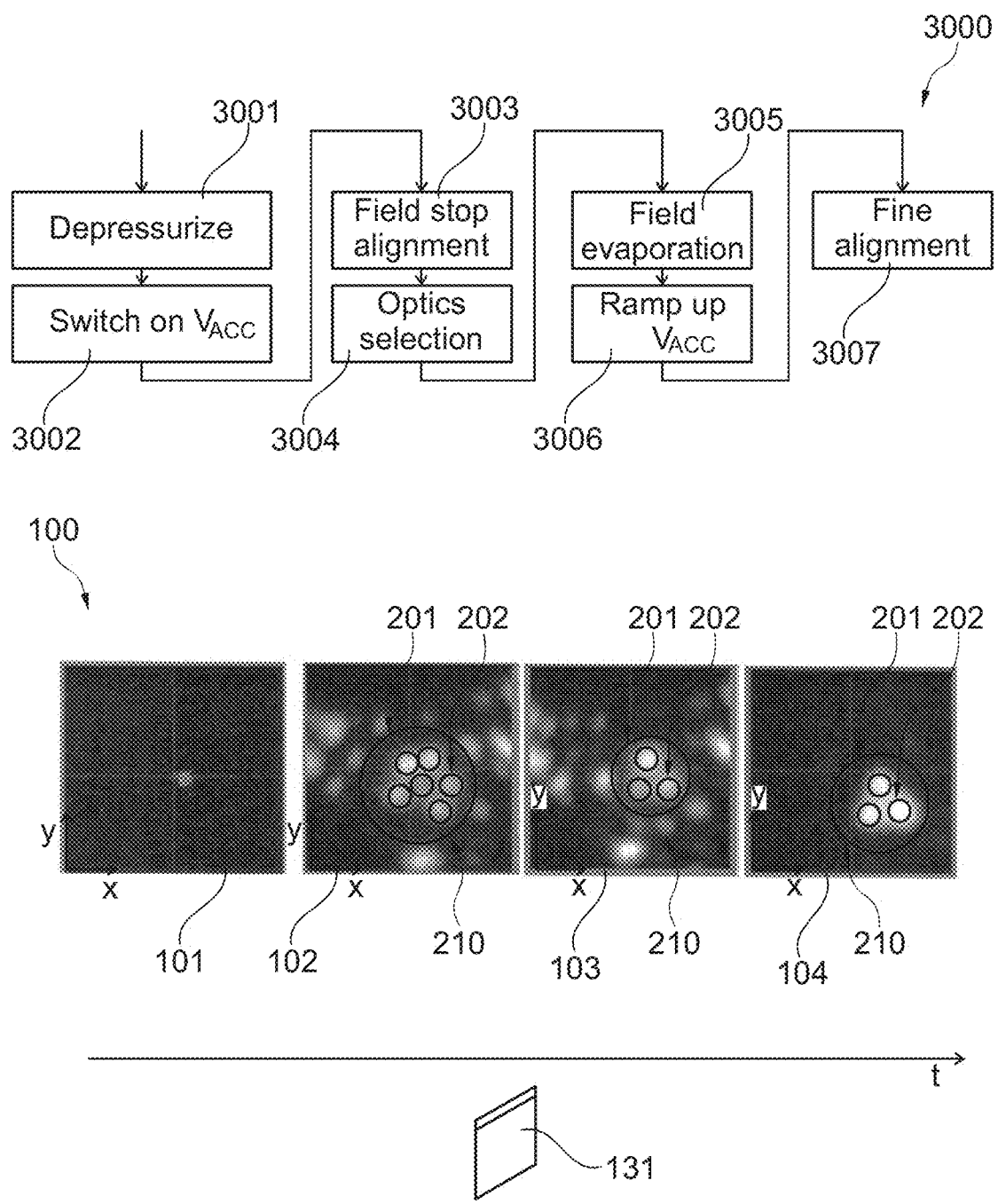
FIG. 3 schematically illustrates a trimer-beamlet feature included in images obtained with an exemplary micro-tooling device and analysed using an algorithm according to various examples.

FIG. 3 illustrates the time series 100 of the images 101-104. The images 101-104 are acquired using a gas-field ion source (GFIS) as imaging module 95. In the example of FIG. 3, the GFIS can implement a three-atom sharp tip to form a so-called trimer.

In FIG. 3, accordingly, a feature 210 is predefined that corresponds to the trimer beamlet. As is illustrated in FIG. 3, the image 101 does not include the trimer beamlet feature 210; while the images 102-104 include the trimer beamlet feature 210. This can be due to changing settings 131 of operational parameters of the imaging module 95.

The trimer beamlet feature 210 can be depicted in the images without a sample 99 being loaded.

The trimer beamlet feature 210 has different properties 201-202 in each one of the images 102-104. A first property 201 pertains to the apex location of the trimer gun within the images 102-104. A second property 202 pertains to the contrast level of the trimer atoms in the images 102-104. Table 1 represents these properties.

TABLE 1

Properties of trimer beamlet feature 210 (cf. FIG. 3)

| Image | Property 201 Location x-y (a.u.) | Property 202 Contrast (a.u.) |
|---|---|---|
| 101 | n/a | n/a |
| 102 | 2.5-1.7 | 2.0 |
| 103 | 2.7-1.7 | 2.2 |
| 104 | 2.7-1.0 | 4 |

It is noted that the properties of the predefined feature as illustrated in Tab. 1 are examples only. Other properties are conceivable. For example, another property that could be defined in connection with the trimer beamlet feature 210 could pertain to the geometrical structure of the trimer beamlet feature 210, e.g., specifying angles between adjacent beamlets, how closely packed the beamlets are, a power spectral density of the trimer beamlet feature, an intensity level, etc., to name just a few examples.

The algorithm 151 can determine such properties and output them.

As will be appreciated, besides such quantitative properties 201-202 that are intrinsic to the appearance of the trimer beamlet feature 210, the trimer beamlet feature 210 also takes different states in the images 101-104. Example states are listed in Table 2.

TABLE 2

Properties of trimer beamlet feature 210 (cf. FIG. 3)

| Image | State of trimer beamlet feature 210 |
|---|---|
| 101 | not detected |
| 102 | too many atoms |
| 103 | trimer beamlet formed |
| 104 | trimer beamlet formed |

In this example, a state can be determined that corresponds with the health of the trimer. For example, the trimer is not detected at all, they may be a misalignment of the trimer gun with an aperture of the GFIS imaging module 95. For example, if the apex of the trimer gun is detected, but too many atoms are visible, the apex may be in bad health, e.g., because it does not form a faceted three-atom tip.

As will be appreciated, the state can correspond to a classification of the appearance of the predefined feature in the images into predefined classes.

It would be possible that the state-of-health is determined. The state-of-health could correspond to a visibility of the predefined feature or a visibility of a predecessor of the predefined feature (here: the multi-atom beamlet in image 102).

FIG. 3 also illustrates aspects with respect to a workflow 3000 associated with the operation of the micro-tooling device 90. In the example scenario of FIG. 3, the workflow 3000 automated using the techniques described herein corresponds to formation and alignment of the trimer for imaging. The state-of-health of the trimer formation and alignment is represented by the trimer beamlet feature 210.

The workflow 3000 may include the following steps. At step 3001, the sample chamber holding the sample 99 is de-pressurized. Then, at step 3002, the acceleration voltage of the atom tip is switched on, e.g., initially to a rather low value. Then, first light is observed which corresponds to image 101.

As the workflow 3000 progresses, a field-stop alignment of an aperture can be executed at step 3003. Also, optics cold be selected, step 3004. For example, focusing can be performed. Then, in image 102, the atom tip becomes visible. However, a trimer is not yet fallen.

Accordingly, the workflow 3000 progresses and at step 3005, the field evaporation of atoms of the atom tip is performed, so as to form the three-atom tip of the apex. At step 3006, it is then possible to ramp up the acceleration voltage. Accordingly, in image 102, the trimer beamlet feature 210 appears and is visible.

As the workflow 3000 further progresses, at step 3007, a fine alignment is performed, which further increases the contrast of the trimer beamlet feature 210 in the image 104.

Thus, as will be appreciated from the above, the trimer beamlet feature 210 is associated with the progress along the workflow 3000.

Also, see Hlawacek, Gregor, et al. "Helium ion microscopy." Journal of Vacuum Science & Technology B, Nanotechnology and Microelectronics: Materials, Processing, Measurement, and Phenomena 32.2 (2014): 020801.

It has been found that sometimes it can be helpful to determine the state of the predefined feature. This is explained in connection with FIG. 4.

Figure 4:
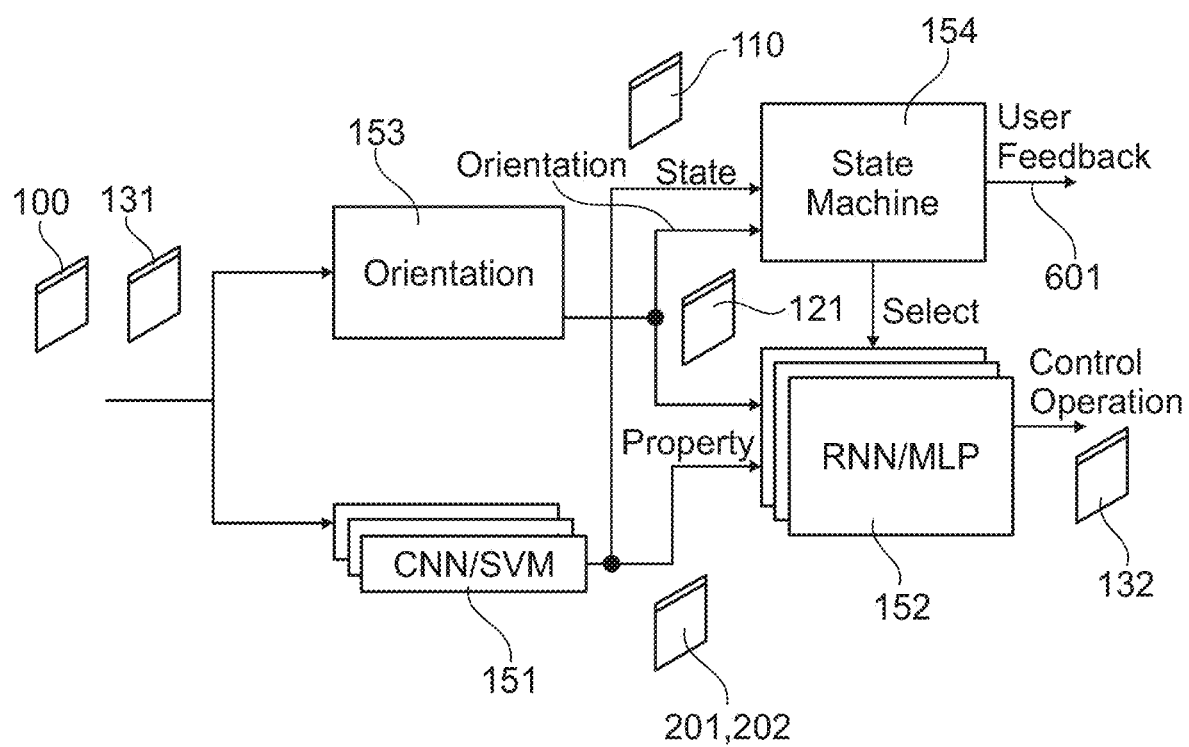
FIG. 4 schematically illustrates automation of a workflow implemented on the micro-tooling device using two sequentially arranged algorithms according to various examples.

FIG. 4 is a functional flowchart. FIG. 4 illustrates aspects in connection with the operational control of the micro-tooling device 90. The example of FIG. 4 is an extension of the example of FIG. 2.

A first extension pertains to providing the one or more first settings 131 used to acquire the time series 100 of the images 101-104 (cf. FIG. 3) as an input to the algorithm 151. Thereby, the algorithm 151 can more accurately determine the properties 201-202 of the predefined feature 210. More accurate and faster training becomes possible.

A second extension pertains to using multiple algorithms 151. For example, as illustrated in FIG. 4, it would be possible to use multiple algorithms 151 to determine, firstly, the properties 201-202 and, secondly, the state 110. For example, a first one of the algorithms 151 could determine the properties 201-202 and a second one of the algorithms 151 could determine the state 110. Thereby, the training dataset of each one of the multiple algorithms 151 may be smaller. Training is facilitated.

In the example of FIG. 4, the state 110 of the predefined feature is used to select the algorithm 152 from multiple candidate algorithms. This is implemented by feeding the state 110 to a state machine 154 that then implements the selection; other implementations would be possible for this selection.

For example, for different states 110 (cf. Tab. 1), different algorithms 152 may be selected for determining the predicted setting 132. Such an implementation can make it possible to use a comparably limited parameter space to be handled by each individual algorithm 152, such as in comparison to a scenario in which a selection depending on the state 110 does not occur. Thereby, training of the algorithms 152 is facilitated. Further, the operation using the algorithms 152 tends to become more accurate.

As illustrated in FIG. 4, it would be possible to provide a user feedback 601 regarding the active state 110. For example, a warning may be issued if the predefined feature is in an unhealthy state. For instance, (re-)calibration may be requested if the predefined feature is in an unhealthy state. The user feedback 601 could be provided to the HMI 93 (cf. FIG. 1).

A a general rule, it would also be possible to also use the state 110 to control the operation of the micro-tooling device 90. As illustrated in FIG. 4, the state 110 can also be input to the selected MLP 152. Optionally, it would also be possible to control the operation of the micro-tooling device 90 in accordance with an output of the state machine 154 (not illustrated in FIG. 4).

A third extension of the implementation of FIG. 4 vis-à-vis the implementation of FIG. 2 pertains to using a third algorithm 153. The algorithm 153 is coupled in parallel to the algorithms 151. The algorithm 153 may not require a machine learning kernel. Rather, a conventional a priori defined algorithm kernel may be used. The algorithm 153 is configured to determine an orientation 121 and/or a localisation of the predefined feature 210 in at least some of the images 101-104 of the time series 100. For example, the algorithm 153 could employ a landmark detection.

For instance, referring to the example of FIG. 3, it would be possible that the algorithm 153 detects an orientation of the trimer beamlet feature 210, e.g., a rotation angle in the x-y coordinate system.

Then, the orientation 121 and/or the localization of the predefined feature is provided as an input to the selected one of the algorithms 152. Optionally, it would also be possible to provide the orientation 121 and/or the localization of the predefined feature as an input to the state machine 154 such that the selection of the algorithm 152 from the candidate algorithms can also depend on this input.

Figure 5:
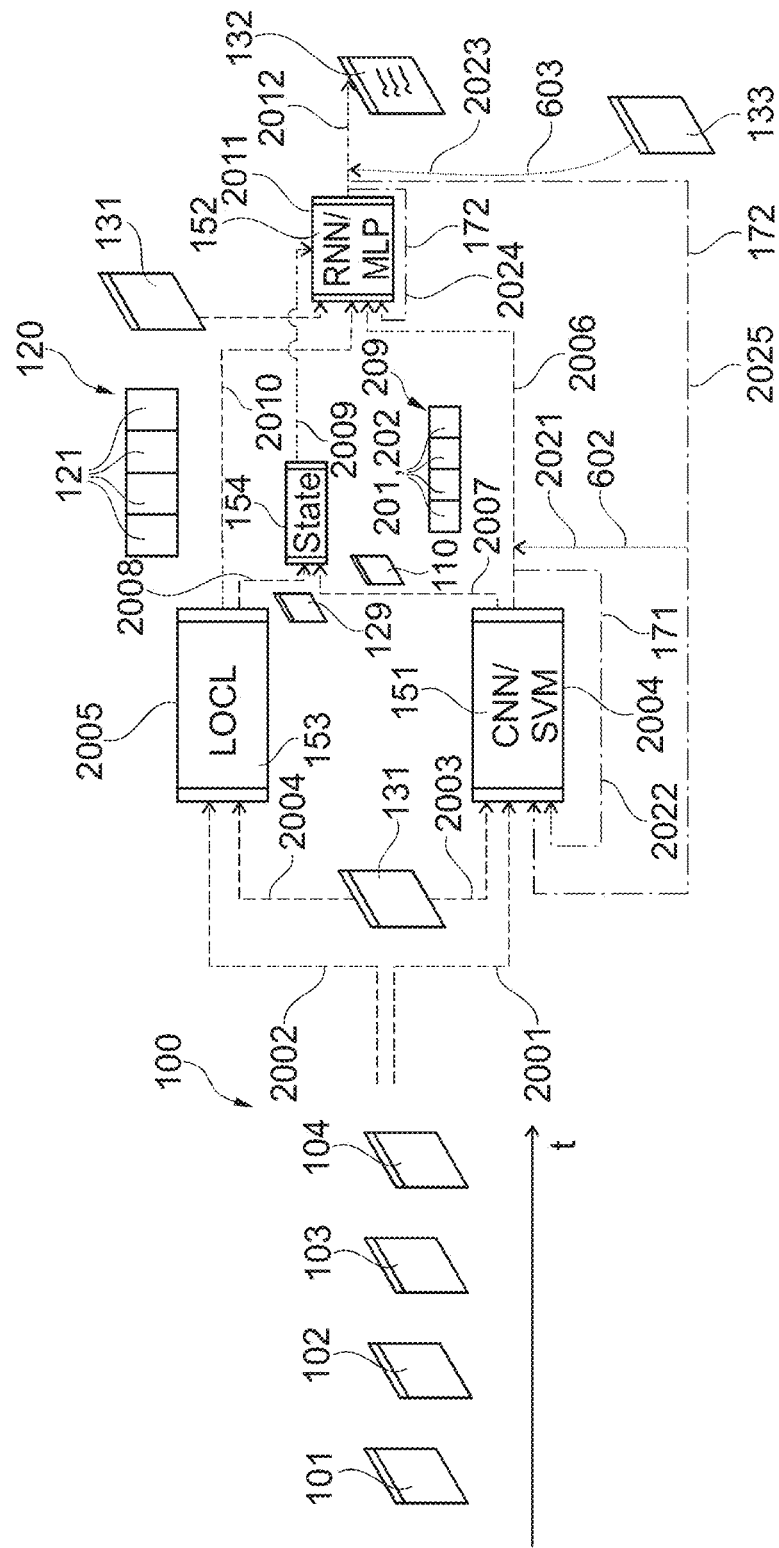
FIG. 5 schematically illustrates automation of a workflow implemented on the micro-tooling device using two sequentially arranged algorithms according to various examples.

FIG. 5 is a functional flowchart. FIG. 5 illustrates aspects in connection with the operational control of the micro-tooling device 90.

At 2001, the time series 100 of images 101-104 is provided to the one or more algorithms 151, as a respective input.

At 2002, the time series 100 of images 101-104 is provided to the algorithm 153, as a respective input.

The setting 131 of the one or more control parameters of the micro-tooling device 90 that has been active while acquiring the images 101-104 is provided, at 2003 and 2004, as an input to the one or more algorithms 151 and the algorithm 153, respectively. This is generally optional.

The one or more algorithms 151 are executed at 2004. Cloud computing would be possible. Offloading to a server would be possible.

The algorithm 153 is executed at 2005. Cloud computing would be possible. Offloading to a server would be possible.

At 2006, the output of the one or more algorithms 151 pertaining to the properties 201-202 of the predefined feature are provided to the algorithm 152. More specifically, as illustrated in FIG. 5, there is a time series 209 of the properties 201-202 (e.g., corresponding to the columns of Tab. 1). This is because each one of the images 101-104 of the time series 100 is individually provided to the one or more algorithms 151 and a respective execution of the one or more algorithms 151 is triggered at 2004. Thus, for each one of the images 101-104 of the time series 100, the respective properties 201-202 of the at least one predefined feature 210 is determined, thereby yielding the time series 209.

At 2007, the state 110 is provided to the state machine 154 that selects, at 2009, the appropriate algorithm 152 from multiple candidate algorithms. This is generally optional. The state machine 154 also obtains the orientation 121 as an input, at 2008; this is again optional.

At 2010, the algorithm 153 provides a time series 120 of the orientation 121 to the algorithm 152. Again, it would be possible that the algorithm 153 is executed multiple times, for each one of the images 101-104 of the time series 100. Thereby, the orientation 121 is determined multiple times, once for each one of the images 101-104, thereby yielding the time series 120.

The algorithm 152 is executed at 2011. Cloud computing may be used. The execution may be offloaded to a server. Then, at 2012, the predicted setting 132 is used to control the operation of the micro-tooling device 90.

FIG. 5 also illustrates aspects with respect to a training of the algorithms 151-152, i.e., a learning phase.

As a general rule, the learning phase may be integrated into the execution phase. I.e., the training may be executed while automating a live workflow. In other examples, the training phase and the execution phase may be separated.

For example, it would be possible to discriminate between (i) execution phase and (ii) training phase based on a control bit that is used to control the operation of the algorithms 151-152. For instance, if the control bit is set, then the training phase may be activated. A training mode, e.g., using error backpropagation, can be implemented.

The training mode could be activated based on user input. For instance, the user may manually switch to training mode. Alternatively, it would be possible to detect any user interaction with a user interface provided by the HMI 93 while the automated workflow is being played out and then switch to training mode upon detecting the user interaction.

First, training of the one or more algorithms 151 is discussed. At 2021, a user input 602 is received, e.g., from the HMI 93 (cf. FIG. 1). The user input 602 pertains to a property 201-202 of the predefined feature. For instance, the user input 602 could manually specify the property of the predefined feature in one or more of the images 101-104. Then, at 2021, a feedback 171 can be provided as a training input to the one or more algorithms 151. The feedback 171 could be based on a comparison of the user input 602 of the predefined feature and the output of the one or more algorithms 151. In another example, the feedback 171 could simply correspond to the user input 602. Based on the feedback 171, a training of the one or more algorithms 151 can be executed. Depending on the particular implementation of the one or more algorithms 151, different training techniques known in the art for training a machine learning kernel of the one or more algorithms 151 can be used.

As will be appreciated, by receiving the user input 602 and using the user input 602 for the training, the algorithm 151 can be trained to determine human-understandable properties, e.g., as discussed in connection with FIG. 3 for the apex localization property 201 and the contrast property 202. This can facilitate continued user-guidance along the automated workflow. The user can understand and react to the output of the one or more algorithms 151.

The training can occur during the workflow. For example, it would be possible that while executing the workflow, the user monitors and interacts with the automated processing in accordance with the algorithms 151-153. Then, an online training becomes possible.

In a similar manner as training of the one or more algorithms 151 has been explained above in connection with the properties 201-202, a training of the one or more algorithms 151 would also be possible with respect to the state 110. The user may manually specify the state 110 and the training may be based on this.

Next, training of the algorithm 152 will be explained. Here, at 2023, a user input 603 is received, e.g., from the HMI 93. The user input 603 can pertain to another setting 133 used for controlling the operation of the micro-tooling device 90. It would then be possible to perform a comparison between the setting 132 predicted by the algorithm 152 and the setting 133 provided by the user and determine a corresponding feedback 172 which is provided as a training input to the algorithm 152, at 2024. Then, the training of the machine learning kernel of the algorithm 152 can be based on the feedback 172, i.e., the comparison between the settings 132 and 133.

A further option for training the algorithms 151-152—that can be applied alternatively or in addition to the training based on the feedback 171-172 would be end-to-end training of the combined sequence of the algorithms 151-152. For example, it would be possible that the feedback 172 is provided, at 2025 is a training input to the one or more algorithms 151.

The end-to-end training allows for the output of the one or more algorithms 151 to not be limited to human-understandable properties of states. Rather, properties of states could be recognised that can be desirable in the accurate operational control.

Figure 6:
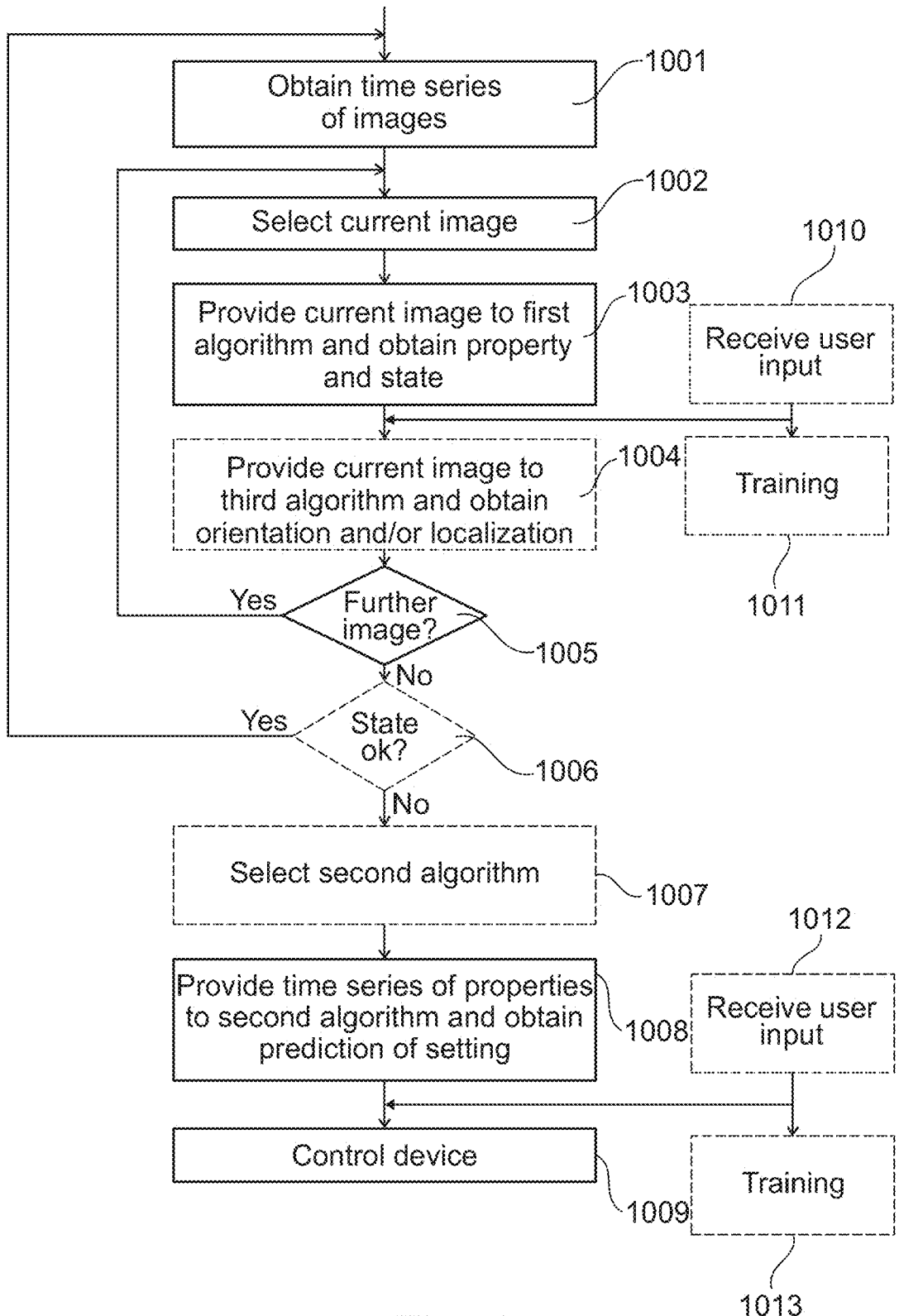
FIG. 6 is a flowchart of a method according to various examples.

FIG. 6 is a flowchart of a method according to various examples. The method of FIG. 6 could be executed by a control circuitry. For example, the method of FIG. 6 could be executed by the processor 91 upon loading program code from the memory 92 (cf. FIG. 1). Optional boxes are denoted with dashed lines in FIG. 6.

At box 1001, a time series of images obtained. The time series of images is captured using an appropriate imaging modality. The time series of images may or may not a microscopic sample. The microscopic sample is mounted in a micro-tooling device, e.g., the micro-tooling device 90 as described above. The time series of images is acquired while one or more first settings of operational parameters of the micro-tooling device are activated.

At box 1002, a current image of the time series of images obtained at box 1001 is selected.

At box 1003, the current image is provided as an input to one or more first algorithms, e.g., the one or more algorithms 151. Thereby, it is possible to obtain a property and/or a state of at least one predefined feature depicted in the current image. Accordingly, box 1003 corresponds to 2001 and 2004 of the example implementation of FIG. 5.

At optional box 1004, the current image is provided as an input to a third algorithm, e.g., the algorithm 153. The third algorithm then determines the orientation and/or the localization of the predefined feature is depicted in the current image. For example, the orientation and/or the localization of the predefined feature could be determined with respect to a reference coordinate system associated with the current image. Accordingly, box 1004 corresponds to 2002 and 2005 of the example implementation of FIG. 5.

At box 1005, it is checked whether there is a further image of the time series available. If yes, then boxes 1002-1004 are re-executed using the further image as current image.

Otherwise, the method commences with optional box 1006. At box 1006, it is checked whether the state output by the first algorithm 1003 is within a predefined set/target range. Thus, with box 1006, it is possible to monitor for the state of the predefined feature. For example, if the state of the predefined feature corresponds to a state-of-health, then degradation of the health of the predefined feature can be detected. Such degradation could be due to temporal drifts of operational parameters.

If the state is acceptable, then there may not be a need to take action; for example, there may be no need to adjust the settings of operational parameters of the micro-tooling device. Accordingly, the method commences with re-executing box 1001. Otherwise, the method commences with optional box 1007.

At optional box 1007, a second algorithm is selected from a plurality of candidate algorithms. For instance, the selection could be based on an output of box 1003 and/or an output of box 1004. More specifically, it would be possible that the selection is based on the state obtained from the one or more first algorithms at box 1003. The selection could also be based on the orientation and/or localization obtained from the third algorithm at box 1004. Accordingly, box 1007 corresponds to 2007-2009 of FIG. 5.

In other examples, the second algorithm may be fixed and predefined.

Figure 7:
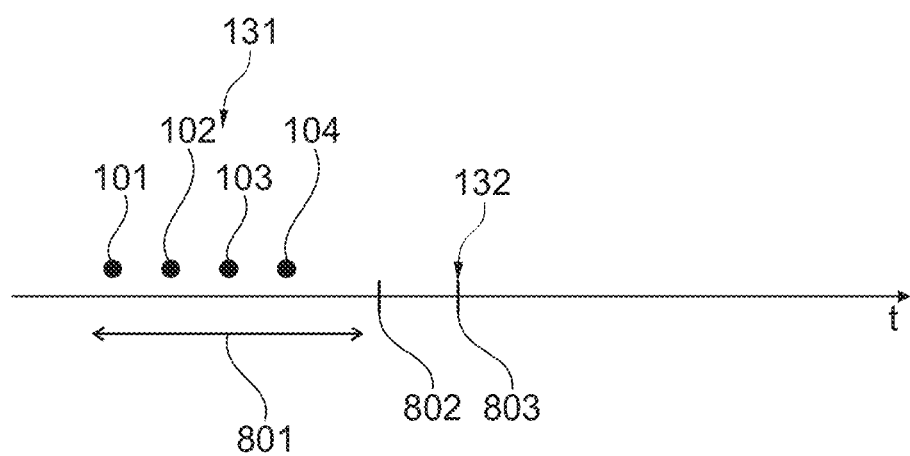
FIG. 7 schematically illustrates the prediction of a setting of operational parameters using an algorithm according to various examples.

Then, the method commences with box 1008. At box 1008, a time series of properties (and, optionally, states, orientation, and/or localization), as obtained from box 1003 (and, optionally, box 1004) is provided as an input to the second algorithm. The second algorithm outputs a prediction of a future setting of operational parameters of the micro-tooling device. This prediction is illustrated in FIG. 7. As illustrated in FIG. 7, during a time interval 801 the images 101-104 of the time series 100 are acquired, while the setting 131 is active. Then, at the point in time 802, the algorithm 152 is executed (corresponding to 2011 in FIG. 5). The algorithm 152 makes a prediction of the setting 132 at a future point in time 803. The setting 132 can then be applied.

Referring again to FIG. 6. At box 1009, the setting predicted at box 1008 can then be used to control the operation of the micro-tooling device.

At optional box 1010, a user input can be received. The user input can be used to refine or adjust the property and/or state provided by the first algorithm at box 1003. Optionally, the user input could also be used for training at box 1011. See FIG. 5: 2022.

At optional box 1012, a further user input can be received. The user input can be used to refine or adjust the predicted setting provided by the second algorithm at box 1008. Optionally, the user input can be used for training, e.g., end-to-end training, at box 1013. See FIG. 5: 2024 and 2025.

Although the disclosure has been shown and described with respect to certain preferred embodiments, equivalents and modifications will occur to others skilled in the art upon the reading and understanding of the specification. The present disclosure includes all such equivalents and modifications and is limited only by the scope of the appended claims.

Summarising, techniques have been described above which facilitate automated control of the operation of the micro-tooling device. The techniques use a first algorithm having a machine learning core and a second algorithm having a machine learning core, the first and second algorithms being sequentially coupled. The first machine learning algorithm determines a progress along a predefined workflow. This can be based on feature recognition of a property and/or a state of the predefined feature associated with the workflow, in images captured when progressing along the workflow. The second machine learning algorithm that obtains the output of the first machine learning algorithm as an input. The second machine learning algorithm then predicts settings of operational parameters of the micro-tooling device, in accordance with the progress along the predefined workflow. By implementing the predicted settings, further progress along the predefined workflow can be made.

For illustration, above, various examples have been described in which a workflow associated with the formation of a trimer of a GFIS imaging module is automated. However, similar examples may also be applied to other kinds and types of micro-tooling devices and other kinds and types of workflows. For example, it would be possible to automate a workflow associated with the alignment of an x-ray imaging module. In another example, it would be possible to automate a workflow associated with electrical and/or optical wafer probing. Here, the stage position and the probe position of multiple probes has to be aligned. The field-of-view, the probe height, imaging parameters, electrical probing parameters, etc. are examples of a few further operational parameters that need to be set appropriately. Instead of deterministically determining all such parameters, according to examples it is possible to implement the techniques described herein using machine-learning algorithms to automate the workflow. This provides a flexible, robust and generic approach to implement wafer probing.

For further illustration, above, various examples have been described in which current settings of operational parameters are provided as an input to algorithms. Alternatively or additionally, it would also be possible to provide measurements associated with the operation of the micro-tooling device as an input to one or more of the described algorithms. Example measurements can include: temperature; pressure; humidity; etc.

What is claimed is:

1. A method, comprising:
    obtaining a time series of images while using one or more first settings of operational parameters of a micro-tooling device;
    providing each image of the time series of the images to one or more first algorithms;
    obtaining, from the one or more first algorithms, a time series of one or more properties of a predefined feature included in the images;
    providing at least some of the images of the time series of images to a third algorithm;
    obtaining, from the third algorithm, at least one parameter selected from the group consisting an orientation of the predefined feature in the at least some of the images and a localization of the predefined feature in the at least some of the images;
    providing to a second algorithm: i) the time series of the one or more properties of the predefined feature included in the images; and ii) the at least one parameter;
    obtaining, from the second algorithm, a prediction for a second setting of the operational parameters of the micro-tooling device; and
    controlling the operation of the micro-tooling device in accordance with the second setting of the operational parameters, wherein the method further comprises:
receiving, from a human-machine-interface, a third setting of the operational parameters of the micro-tooling device;
comparing the second and third settings of the operational parameters of the micro-tooling device; and
training a machine-learning kernel of the second algorithm based on the comparison of the second and third settings of the operational parameters of the micro-tooling device.

2. The method of claim 1, further comprising:
obtaining a state of the predefined feature from the one or more first algorithms; and
selecting the second algorithm from a plurality of candidate algorithms at least partially based on the state of the predefined feature.

3. The method of claim 2, further comprising selecting the second algorithm from the plurality of candidate algorithms at least partially based on the at least one parameter.

4. The method of 2, further comprising:
monitoring the state of the predefined feature; and
at least partially based on monitoring the state of the predefined feature, selectively triggering control of the operation of the micro-tooling device in accordance with the second setting.

5. The method of claim 2, wherein the state of the predefined feature comprises a state-of-health of the predefined feature.

6. The method of claim 5, wherein the state-of-health of the predefined feature is indicative of at least one member selected from the group consisting of a visibility of the predefined feature in its respective image, and a visibility of a predecessor of the predefined feature in its respective image.

7. The method of claim 1, wherein the one or more properties of the predefined feature comprise at least member selected from the group consisting of a sharpness of the predefined features, a contrast level of the predefined feature, a localization of the predefined feature, and a geometrical structure of the predefined feature.

8. The method of claim 1, further comprising:
end-to-end training machine-learning kernels of the one or more first algorithms and the second algorithm based on the comparison of the second and third settings of the operational parameters of the micro-tooling device.

9. The method of claim 1, further comprising:
receiving, from the human-machine-interface, a user input of the predefined feature in at least one image of the time series of images; and
training a machine-learning kernel of the one or more first algorithms based on the user input.

10. The method of claim 1, further comprising providing the one or more first settings of the operational parameters to at least one of the one or more first algorithms or to the second algorithm.

11. The method of claim 1, wherein the predefined feature in the images of the time series comprises a trimer beamlet of a gas-field ion source of the micro-tooling device.

12. The method of claim 1, wherein the predefined feature is associated with a progress along a predefined workflow associated with the operation of the micro-tooling device.

13. One or more machine-readable hardware storage devices comprising instructions that are executable by one or more processing devices to perform operations comprising the method of claim 1.

14. A system comprising:
one or more processing devices; and
one or more machine-readable hardware storage devices comprising instructions that are executable by the one or more processing devices to perform operations comprising the method of claim 1.

15. A method, comprising:
obtaining a time series of images while using one or more first settings of operational parameters of a micro-tooling device;
providing each image of the time series of the images to one or more first algorithms;
obtaining, from the one or more first algorithms, a time series of one or more properties of a predefined feature included in the images;
providing at least some of the images of the time series of images to a third algorithm;
obtaining, from the third algorithm, at least one parameter selected from the group consisting an orientation of the predefined feature in the at least some of the images and a localization of the predefined feature in the at least some of the images;
providing to a second algorithm: i) the time series of the one or more properties of the predefined feature included in the images; and ii) the at least one parameter;
obtaining, from the second algorithm, a prediction for a second setting of the operational parameters of the micro-tooling device; and
controlling the operation of the micro-tooling device in accordance with the second setting of the operational parameters,
wherein the method further comprises:
receiving, from a human-machine-interface, a user input of the predefined feature in at least one image of the time series of images; and
training a machine-learning kernel of the one or more first algorithms based on the user input.

16. One or more machine-readable hardware storage devices comprising instructions that are executable by one or more processing devices to perform operations comprising the method of claim 15.

17. One or more machine-readable hardware storage devices comprising instructions that are executable by one or more processing devices to perform operations comprising the method of claim 15.

18. A method, comprising:
obtaining a time series of images while using one or more first settings of operational parameters of a micro-tooling device;
providing each image of the time series of the images to one or more first algorithms;
obtaining, from the one or more first algorithms, a time series of one or more properties of a predefined feature included in the images;
providing at least some of the images of the time series of images to a third algorithm;
obtaining, from the third algorithm, at least one parameter selected from the group consisting an orientation of the predefined feature in the at least some of the images and a localization of the predefined feature in the at least some of the images;
providing to a second algorithm: i) the time series of the one or more properties of the predefined feature included in the images; and ii) the at least one parameter;
obtaining, from the second algorithm, a prediction for a second setting of the operational parameters of the micro-tooling device; and controlling the operation of the micro-tooling device in accordance with the second setting of the operational parameters,
    wherein the predefined feature in the images of the time series comprises a trimer beamlet of a gas-field ion source of the micro-tooling device.

19. One or more machine-readable hardware storage devices comprising instructions that are executable by one or more processing devices to perform operations comprising the method of claim 18.

20. One or more machine-readable hardware storage devices comprising instructions that are executable by one or more processing devices to perform operations comprising the method of claim 18.

* * * * *

UNITED STATES PATENT AND TRADEMARK OFFICE
CERTIFICATE OF CORRECTION

PATENT NO. : 12,176,182 B2  
APPLICATION NO. : 17/580996  
DATED : December 24, 2024  
INVENTOR(S) : Ramani Pichumani et al.

Page 1 of 1

It is certified that error appears in the above-identified patent and that said Letters Patent is hereby corrected as shown below:

On the Title Page

Column 2, Item (56), Line 26, delete "R.." insert -- R., --.

In the Specification

Column 1, Line 11, delete "2019, 2014." insert -- 2019 --.

Column 10, Line 17, delete "A a" insert -- As a --.

In the Claims

Column 15, Line 20, Claim 4, delete "2," insert -- claim 2, --.

Signed and Sealed this  
Eighteenth Day of March, 2025

Coke Morgan Stewart  
*Acting Director of the United States Patent and Trademark Office*